(12) United States Patent
Mansoori et al.

(10) Patent No.: US 7,427,543 B2
(45) Date of Patent: Sep. 23, 2008

(54) METHOD TO IMPROVE DRIVE CURRENT BY INCREASING THE EFFECTIVE AREA OF AN ELECTRODE

(75) Inventors: Majid M. Mansoori, Dallas, TX (US); Christoph A. Wasshuber, Cambridge, MA (US)

(73) Assignee: Texas Instruments Incorporated, Dallas, TX (US)

( * ) Notice: Subject to any disclaimer, the term of this patent is extended or adjusted under 35 U.S.C. 154(b) by 135 days.

(21) Appl. No.: 11/462,914

(22) Filed: Aug. 7, 2006

(65) Prior Publication Data

US 2006/0275992 A1    Dec. 7, 2006

Related U.S. Application Data

(62) Division of application No. 10/989,480, filed on Nov. 16, 2004, now Pat. No. 7,109,556.

(51) Int. Cl.
*H01L 21/336* (2006.01)
*H01L 21/8234* (2006.01)

(52) U.S. Cl. ............... 438/197; 438/647; 438/652

(58) Field of Classification Search ........... 438/197, 438/647, 652, 655
See application file for complete search history.

(56) References Cited

U.S. PATENT DOCUMENTS

| | | | |
|---|---|---|---|
| 3,830,657 A | 8/1974 | Farrar | |
| 5,112,773 A | 5/1992 | Tuttle | |
| 5,554,566 A * | 9/1996 | Lur et al. | 438/655 |
| 5,619,057 A | 4/1997 | Komatsu | |
| 5,719,083 A | 2/1998 | Komatsu | |
| 5,907,789 A | 5/1999 | Komatsu | |
| 6,043,124 A * | 3/2000 | Wu | 438/260 |
| 6,121,081 A | 9/2000 | Thakur | |
| 6,159,785 A | 12/2000 | Tsuchimoto et al. | |
| 6,312,987 B1 | 11/2001 | Han et al. | |
| 6,440,795 B1 * | 8/2002 | Harshfield | 438/255 |
| 6,521,515 B1 | 2/2003 | Kluth | |
| 6,764,916 B1 | 7/2004 | Furukawa et al. | |
| 6,838,127 B2 | 1/2005 | Yun | |
| 6,849,501 B2 * | 2/2005 | Rudeck | 438/257 |
| 6,872,622 B1 * | 3/2005 | Tu | 438/253 |
| 6,876,029 B2 | 4/2005 | Lee et al. | |
| 6,930,015 B2 | 8/2005 | Ping et al. | |
| 7,015,528 B2 * | 3/2006 | McClure | 257/306 |

OTHER PUBLICATIONS

Berger, S., "Microstructure evolution of nanometer-sized hemispherical-grained Si deposited by RTCVD," Department of Materials Engineering, Technion, Haifa 32000, Israel (2001), 3 pages.

Banerjee, Aditi, et al., "Fabrication and performance of selective HSG storage cells for 256 Mb and 1 Gb DRAM applications," IEEE Transactions on Electron Devices, vol. 47, No. 3, Mar. 2000, 9 pages.

(Continued)

*Primary Examiner*—Fernando L Toledo
(74) *Attorney, Agent, or Firm*—Frederick J. Telecky, Jr.; Wade J. Brady, III

(57) ABSTRACT

The present invention provides source/drain electrode 100 for a transistor 105. The source/drain electrode 100 comprises a plurality of polysilicon grains 100 located over a source/drain region 115. A metal salicide layer 120 conformally coats the plurality of polysilicon grains. The present invention also includes a method of fabricating the above described source/drain electrode 200, and integrated circuit 800 have includes a semiconductor device 805 having the described source/drain electrodes 810.

6 Claims, 4 Drawing Sheets

OTHER PUBLICATIONS

Mansoori, M. M., et al., "Selective hemispherical grained polysilicon transformation for 256 MB, 1 GB dynamic random access memory and beyond," reprinted from Journal of the Electrochemical Society, vol. 146, No. 10, Oct. 1999, 7 pages.

* cited by examiner

METHOD TO IMPROVE DRIVE CURRENT BY INCREASING THE EFFECTIVE AREA OF AN ELECTRODE

This application is a divisional of application Ser. No. 10/989,480, filed Nov. 16, 2004.

TECHNICAL FIELD OF THE INVENTION

The present invention is directed in general to the manufacture of semiconductor devices, and, more specifically, to a source/drain electrode and method of fabrication thereof.

BACKGROUND OF THE INVENTION

The continuing demand for increasing computational power and memory space is driving the miniaturization of integrated circuits and their component parts. For instance, the aggressive scale-down of metal oxide semiconductor (MOS) transistor critical dimensions has shrunk the length and width dimensions of the source/drain electrode into the nanometer regime. One concern arising from this scale down is that an increased sheet resistance of smaller dimensioned salicided source/drain electrodes will decrease the drive current of the MOS transistor for a given gate-drain capacitance.

Previous efforts to maintain the drive current within acceptable limits, as the critical dimensions of the MOS transistors are scaled down, have focused on changing the metals used in the source/drain electrode. Specifically, with each reduction in technology node, lower resistivity metals have been used. Thus, metal salicide source/drain electrode have transitioned from titanium salicide to cobalt salicide, and now currently to nickel salicide. The transition to different metal salicides is not without problems however. Cobalt salicides are subject to resistivity degradation due to the well-known necking phenomenon observed at device feature sizes of less than about 90 nanometers. Nickel salicides, while having a lower resistivity than titanium or cobalt salicides, suffers from thermal instability and the formation of spike defects that can extend into the channel region of the transistor, resulting in shorts and increased leakage current.

Accordingly, what is needed in the art is a method of increasing drive current in semiconductor devices that is compatible with existing metal salicide source/drain electrode fabrication schemes that overcomes the above-mentioned problems, and in particular that minimizes source/drain electrode resistivities at technology nodes of about 90 nanometers and lower.

SUMMARY OF THE INVENTION

To address the above-discussed deficiencies of the prior art, the present invention provides a source/drain electrode for a transistor. The source/drain electrode has a plurality of polysilicon grains located over a source/drain region. A metal salicide layer conformally coats the plurality of polysilicon grains.

In another embodiment, the present invention provides a method of manufacturing a source/drain electrode for a semiconductor device. The method comprises forming a silicon layer on a source/drain region and depositing seed atoms on the silicon layer. The seed atoms and the silicon layer are transformed to form a plurality of polysilicon grains over the source/drain region.

Yet another embodiment of the present invention provides an integrated circuit. The integrated circuit comprises a semiconductor device having source/drain electrodes comprising a plurality of polysilicon grains located over a source/drain region and a metal salicide layer conformally coating the plurality of polysilicon grains. The integrated circuit further includes interconnect metals lines on one of more insulating layers located over the semiconductor device. The interconnect metal lines interconnect the source/drain electrodes of the semiconductor device to form an operative device.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the advantages of using polysilicon grains in source/drain electrodes to increase their effective surface area without increasing the perimeter of the electrode. A source/drain electrode of the present invention comprises a metal salicide layer conformally coating a plurality of polysilicon grains over or on the surface of a source/drain region. The source/drain electrode has a lower sheet resistance because the effective surface area of the metal salicide layer of the source/drain electrode is increased. Consequently, transistors with such source/drain electrodes have a higher drive current than transistors with conventional source/drain electrodes.

According to the principles of the present invention, it is desirable to create an electrode with a highly contoured surface because this increases the effective surface area of the metal salicide layer in the source/drain electrode. This is in contrast to conventional design principles in source/drain electrode fabrication, which endeavor to produce a substantially planar metal salicide layer. Traditional source/drain electrode fabrication processes are tailored to avoid roughing the surface of the metal salicide layer because a roughened surface can have an unacceptably high contact resistance at the interface between a metal interconnect and the metal salicide layer.

As part of the present invention, it is recognized the surface of a source/drain electrode can be characterized as having both a micro-roughness and a macro-roughness. For the purposes of the present invention, a micro-roughness is defined as a RMS (root-mean-square) height variation of the surface that is less than about 1 nanometer, while a macro-roughness has a RMS of 1 nanometer or more. Moreover, a micro-roughness is produced as an artifact of various steps in semiconductor device fabrication, such as plasma processes, the cleaning steps and etching procedures. In contrast, in the present invention, a macro-roughness is intentionally produced by forming polysilicon grains, whose size is large enough to not contribute to micro-roughness of the metal-salicide surface. The present invention recognizes for the first time that it is desirable to minimize contact resistance by minimizing the micro-roughness, while at the same time providing a certain macro-roughness to increase the effective surface area of the electrode to minimize sheet resistance.

Figure 1:
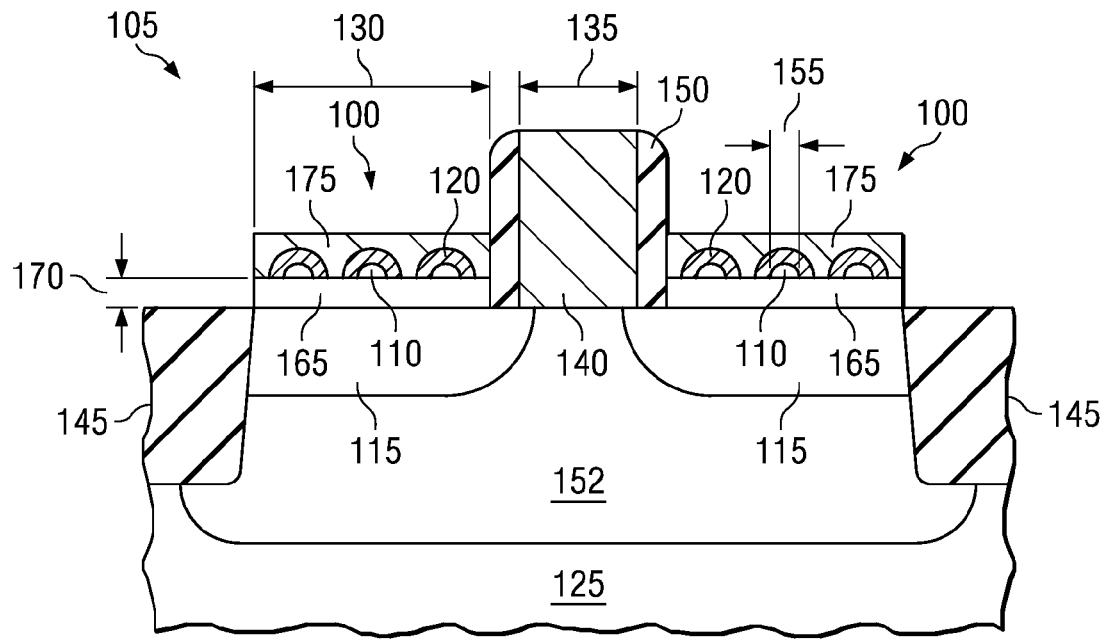
FIG. 1 illustrates a cross-sectional view of an exemplary source/drain electrode for a transistor of the present invention.

One embodiment of the present invention is shown in FIG. 1, which illustrates a cross-sectional view of an exemplary source/drain electrode 100 for a transistor 105. A plurality of polysilicon grains 110 located over a source/drain region 115 and a metal salicide layer 120 conformally coating the plurality of polysilicon grains 110.

One skilled in the art would understand how a portion of the semiconductor substrate 125 is doped with n-type or p-type dopants, followed by an activating anneal to form the source/drain region 115. As also well know to those skilled in the art, the size of the source/drain region 115 is adjusted for the technology node of interest. In some cases, the length 130 of the source/drain region 115 is scaled as a function of the length 135 of a gate 140. In some designs the length 130 of the source drain region 115 is 1 to 2 times the gate length 135. For instance, for a gate length 135 of about 65 nanometers, in some embodiments, the source/drain region 115 has a length 130 of about 110 nanometers.

In certain preferred embodiments, the transistor 105 is a MOS transistor such as an nMOS or a pMOS transistor. The transistor 105 can have any number of conventional transistor components, including isolation structures 145, such as shallow trench isolation or field oxide structures, gate sidewalls 150 and a doped well 152.

The process for forming the polysilicon grains 110 results in grains that are substantially spherical, and hence are often referred to as hemispherical polysilicon grains (HSGs). In certain preferred embodiments, for example, the HSGs 110 have an average diameter 155 of at least about 2 nanometers. In such embodiments, the surface roughness would be greater than about 1 nanometers, and more preferably greater than about 2 nanometers. In other preferred embodiments, the HSGs 110 have an average diameter 155 of between about 10 nanometers and about 30 nanometers.

It is desirable for the density of HSGs 110 on the source/drain region 115 to be large enough to increase the effective surface area of the region 115, but not so dense that the metal salicide layer 120 coating individual HSGs 110 contact each other. Consider, for example, the source/drain region 115 having a length 130 of about 90 nanometers and width, corresponding to the dimension coming out of the page of the cross-sectional view shown in FIG. 1, equal to about 150 nanometers. It is estimated that about 675 HSGs 110 having a average diameter 155 of about 10 nanometers could be formed on the source/drain region 115 corresponding to a density of about 1 HSG per 22 square nanometer area of the region (e.g., (150 nm×90 nm)/675 HSGs). For such a configuration, it is further estimated that the effective surface area of the source/drain region 115 is about 16200 nm$^2$, an about 20 percent increase as compared to the area (e.g., 150 nm×90 nm=13500 nm$^2$) defined by the dimensions of the region 115. It is predicted that the reduced sheet resistance of source/drain electrodes 100 having such a configuration would allow the transistor 105 to have an at least about 4 to about 7 percent increase in drive current.

A broad range of densities of HSGs 110 on the source/drain region 115 are within the scope of the present invention. As a non-limiting example, for a source/drain region 115 having a width of about 180 nanometers and length 130 of about 200 nanometers, HSGs 110 having an average diameter 155 of about 2 nanometers could be formed at a density of about 1 HSG per 4 nm$^2$ of the source/drain region, and corresponding to about 9000 HSGs 110 on the region 115. As another example, for a source/drain region 115 having a width of about 65 nanometers and length 130 of about 100 nanometers, HSGs having an average diameter of about 40 nanometers could be formed at a density of about 1 HSG per 1625 nm$^2$ of the source/drain region 115, and corresponding to about 4 HSG 155 on the region 115.

As further explained below, the bulk of the polysilicon grains 110 is made of atoms from a silicon layer 165, and more preferably, an amorphous silicon layer. In some cases, the silicon layer 165 is not necessarily entirely consumed by forming the polysilicon grains 110, and therefore portions of the silicon layer 165 remain in the final structure of the source/drain electrode 100 as shown in FIG. 1. The size of the polysilicon grains 110 can be controlled by adjusting the thickness 170 of the silicon layer 165. For instance, the polysilicon grains 110 can have an average diameter 155 equal to between about 0.6 and about 0.9 times the thickness 170 of the silicon layer 165.

The size of the polysilicon grains 110 can also be adjusted through the inclusion of dopants, such as n-type or p-type dopants in the polysilicon grains 110. During the formation of the polysilicon grains 110, dopants implanted into the source/drain region 115 can diffuse into the silicon layer 165 and those dopant atoms can be incorporated into the polysilicon grains 110. Alternatively, dopants that were included in the formation of the silicon layer 165 can be incorporated into the polysilicon grains 110. In some instances, n-type dopants such as arsenic or phosphorous, promotes the formation of larger polysilicon grains 110. In other instances, the presence of p-type dopants such as boron, promotes the formation of smaller polysilicon grains 110. Moreover, the silicon layer 165 and polysilicon grains 110 can be advantageously implanted with dopants to increase their conductivity.

In some advantageous embodiments of the source/drain electrode 100, the metal salicide layer 120 comprises a transition metal. In certain preferred embodiments the metal salicide layer 120 comprises nickel salicide. In other embodiments, however, the metal salicide layer comprises cobalt salicide or tungsten salicide. Some embodiments of the source/drain electrode 100 further include a metal layer 175 over the metal salicide layer 120. In some cases, the metal layer 175 comprises the same metal as in the metal salicide layer 120 while in other case the metal layer 175 comprises an different metal.

Another aspect of the present invention is a method of manufacturing a source/drain electrode. FIGS. 2 to 7 illustrate cross-sectional views of selected steps in an exemplary method of manufacturing a source/drain electrode 200 for a semiconductor device 205 according to the principles of the present invention. The method can include any of the embodiments of the source/drain electrode discussed above and shown in FIG. 1.

Figure 2:
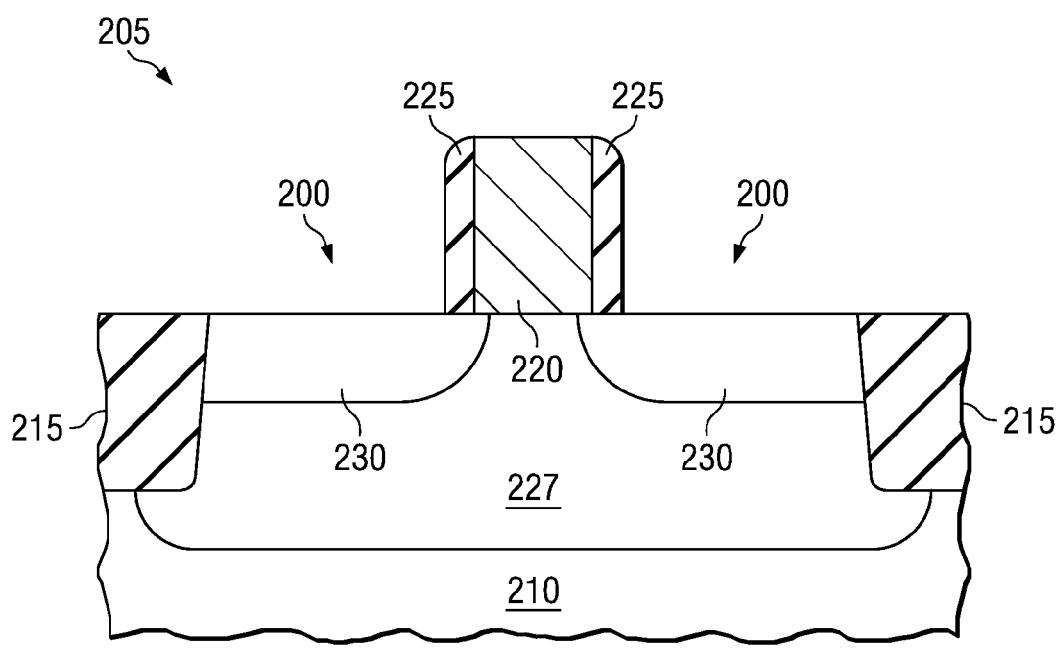
FIGS. 2 to 7 illustrate cross-sectional views of selected steps in an exemplary method for manufacturing a source/drain electrode for a semiconductor device according to the principles of the present invention.

Turning first to FIG. 2, illustrated is the semiconductor device 205, embodied here as a MOS transistor, after forming various device components using conventional methods. The semiconductor device 205 comprises a semiconductor substrate 210, isolation structures 215, gate 220, sidewall spacers 225, doped well 227 and source/drain region 230. Of course, the semiconductor device 205 can include various other device components fabricated using conventional processes familiar to those skilled in the art.

Figure 3:
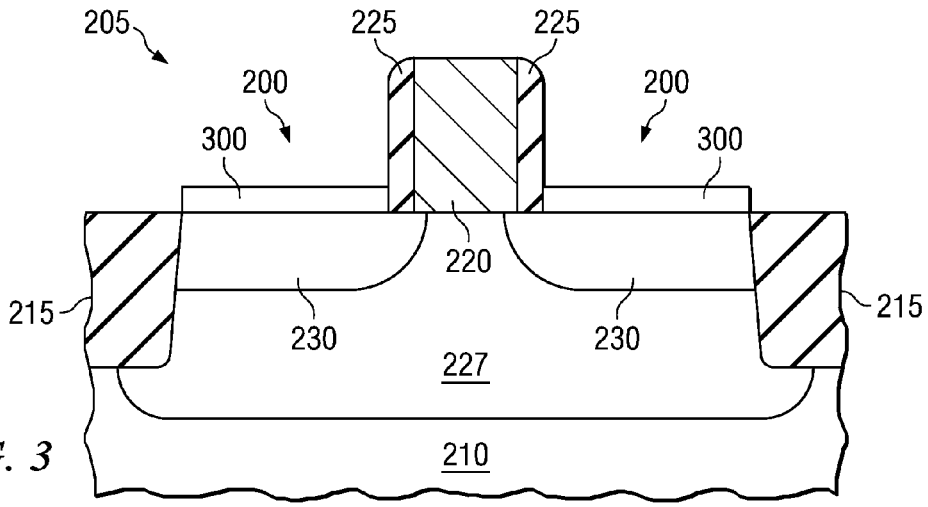

Turning now to FIG. 3, shown is the partially constructed source/drain electrode 200 after forming a silicon layer 300 over the source/drain region 230. Preferably, the silicon layer 300 is an amorphous silicon layer. The silicon layer 300 can be formed by depositing silicon atoms via chemical vapor deposition (CVD) or atomic layer deposition (ALD). In some cases, CVD is preferred because CVD tools are readily available in existing semiconductor fabrication plants.

It is advantageous for the silicon layer 300 to be selectively deposited on the source/drain region only. Selective deposition obviates the need for additional mask steps to avoid undesirable deposition of silicon on sidewall spacers 225 and isolation structures 215 or other device components. In some cases, selective deposition is facilitated by carrying out the CVD process at low temperatures and under ultra high vacuum (UHV) conditions. For instance, temperatures of less than about 600° C., and more preferably less than about 500° C., are preferred. Exemplary UHV conditions include a CVD chamber pressure of less than about $1 \times 10^{-6}$ Torr. Alternatively, the silicon layer 300 can be selectively deposited under low pressure (LP) CVD conditions, for example chamber pressures of between about $1 \times 10^{-3}$ and about $1 \times 10^{-6}$ Torr, if a chlorine-bearing species, such as hydrochloric acid, is included in the deposition chamber. As noted above n-type or p-type dopants can be included in the deposition of the silicon layer 300.

Figure 4:
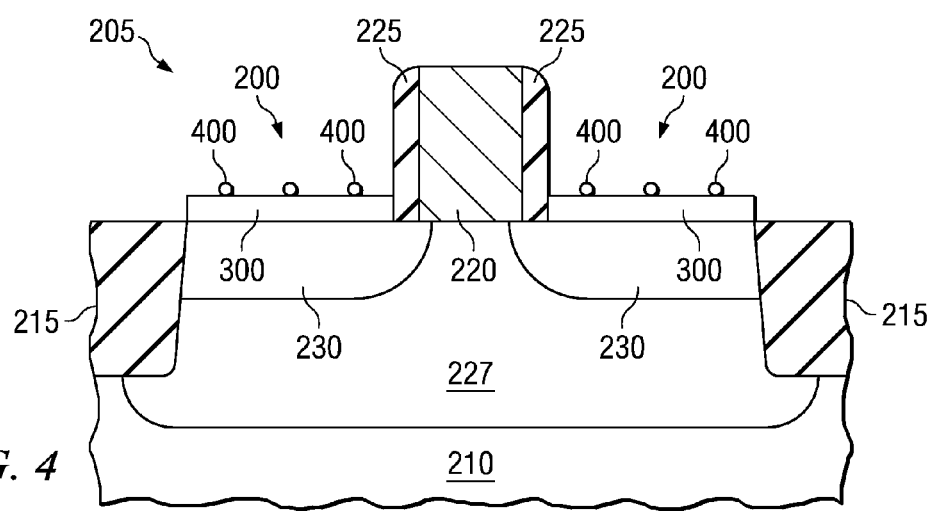

Referring now to FIG. 4, depicted is the partially constructed source/drain electrode 200 after depositing seed atoms 400 on the silicon layer 300. Preferred embodiments of the seed atoms 400 comprise silicon, germanium or silicon germanium. The seed atoms, however, can comprise any atoms that promote polysilicon grain formation. The seed atoms 400 are preferably deposited by CVD. In some cases the same CVD tool is used to deposit the silicon layer 300 and the seed atoms 400. One skilled in the art would be familiar with the conventional procedures used to deposit the seed atoms 400. In some embodiments, for example, the deposition of seed atoms 400 comprising silicon are deposited by introducing a silicon-bearing CVD precursor, such as disilane gas, into the CVD chamber under LP or UHV conditions in combination with heating to between about 550° C. and about 650° C. to decompose the disilane molecules.

Figure 5:
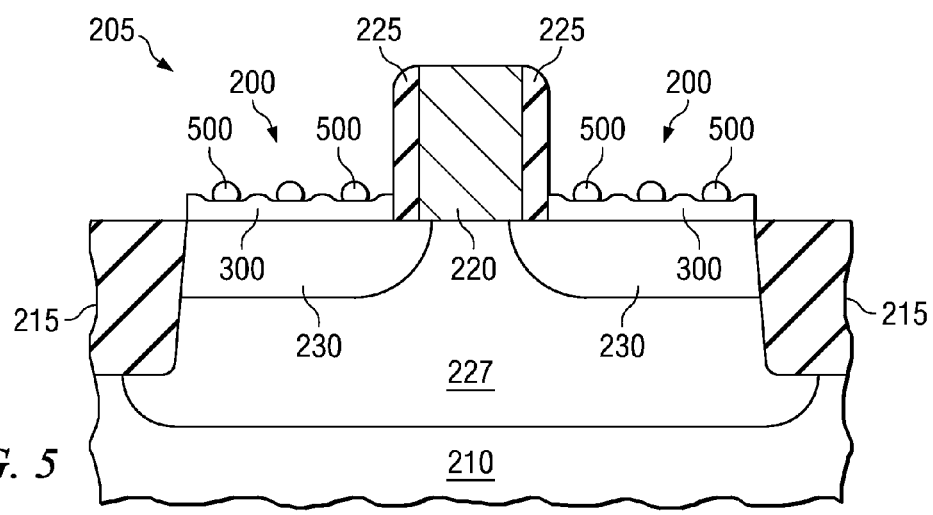

Turning now to FIG. 5, presented is the partially constructed source/drain electrode 200 after transforming the silicon layer 300 and seed atoms 400 to form a plurality of polysilicon grains 500 over the source/drain region 230. Transforming refers to a process where at least a portion of the atoms of the silicon layer 300 migrate and couple to the seed atoms 400 and each other to form the individual polysilicon grains 500. Thus, a portion of the silicon layer 300 and the seed atoms 400 are transformed into the polysilicon grains 500. Of course, in some embodiments, the entire silicon layer 300 and seed atoms 400 are transformed into the polysilicon grains 500.

As discussed above, in certain preferred embodiments, the polysilicon grains 500 are HSGs, and the size of the HSG will depend upon the thickness of the silicon layer 300. The size of the HSGs 500 also depends on the conditions under which the transformation is carried out. In some cases, it is advantageous for the transformation to be carried out in the same deposition tool, such as a CVD tool, as used for depositing the seed atoms, as this can reduce the cost of semiconductor device 205 fabrication. In some cases it is desirable for the transformation to comprise annealing, preferably in a dedicated annealing chamber or furnace, of the silicon layer 300 and seed atoms 400 by heating to a temperature of between about 500° C. and about 650° C. Preferably, transforming is carried out under ultraclean conditions. Exemplary ultraclean conditions include a water partial pressure of less than about $1 \times 10^{-7}$ $H_2O$ molecules/cm$^3$, and even more preferably, less than about $1 \times 10^{-8}$ $O_2$ molecules/cm$^3$. In some cases, it is desirable to conduct the transformation under UHV condition while in other instances LP conditions are used.

Figure 6:
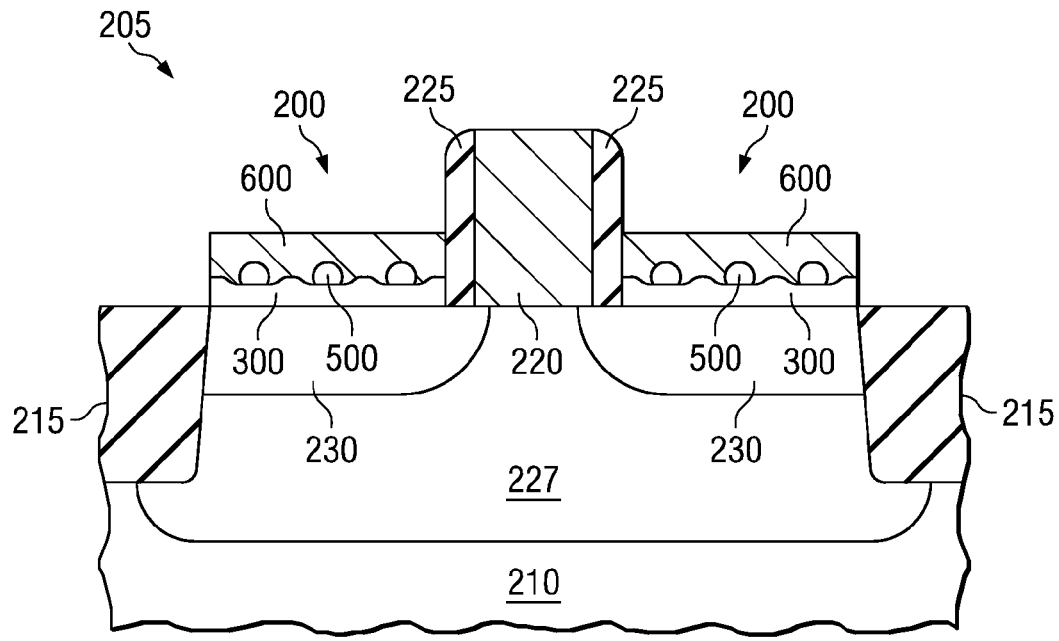

With reference now to FIG. 6, shown is the partially constructed source/drain electrode 200 after depositing a transition metal layer 600 over polysilicon grains 500. In some embodiments the transition metal layer 600 is blanket deposited over the entire surface of the semiconductor device 205. In some instances, it is preferable to preclean to remove the oxides and other contaminants from the surface of the source/drain region 230 and polysilicon grains 500 before depositing the transition metal layer 600. Exemplary precleaning conditions include a wet etch comprising hydrofluoric acid.

Transition metal atoms are preferably deposited via physical vapor deposition (PVD). In some advantageous embodiments, the transition metal layer 600 has a thickness of between about 1 nanometer and about 30 nanometers. In some preferred embodiments of the method, the transition metal atoms comprise nickel and salicidation results in the formation of a nickel salicide, and more preferably, nickel monosalicide layer. The transition metal atoms, however, can also comprise titanium, cobalt, platinum and palladium, and combinations of these or other transition metals.

A preferred PVD method is sputtering from a transition metal target. One of ordinary skill in the art would understand how to adjust and to select the sputtering method and conditions to deposit the transition metal atoms. Of course, sputtering can be accomplished using other techniques including alternating current, radio frequency, magnetron or other commercially available sputtering systems. Moreover, other conventional PVD techniques, including evaporative deposition, molecular beam epitaxy, ion plating, ion beam assisted deposition using an electron beam evaporator and arc vapor deposition are also within the scope of the present invention.

Figure 7:
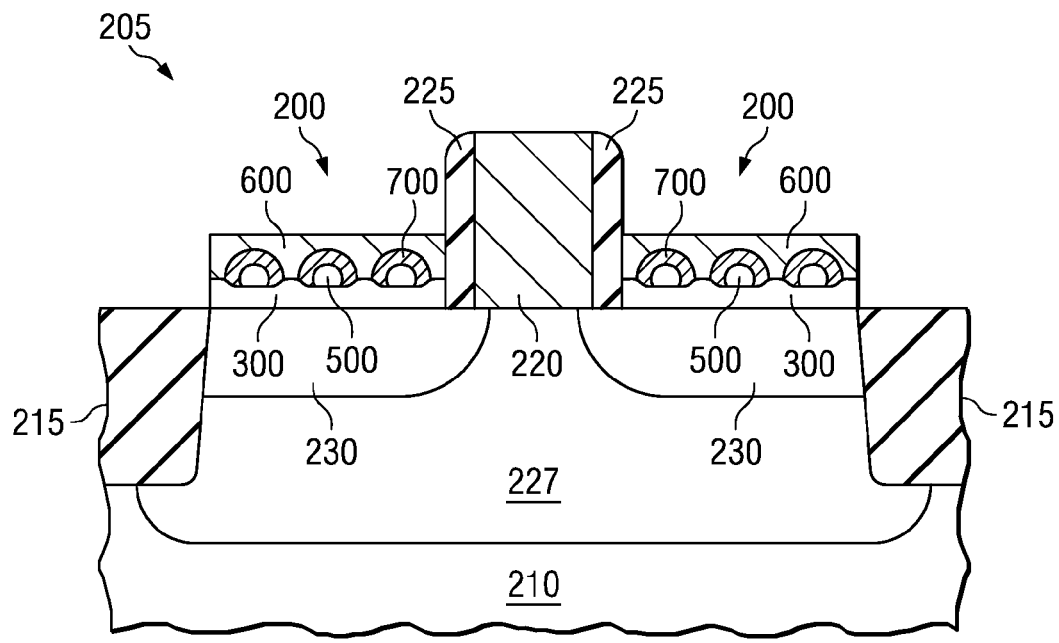

Turning now to FIG. 7, illustrated is the partially constructed source/drain electrode 200 after reacting at least a portion of the transition metal layer 600 and the polysilicon grains 500 to form a metal salicide layer 700 that conformally coats the polysilicon grains 500.

In some advantageous embodiments of the method, the reaction to form the metal salicide layer 700 comprises heating the polysilicon grains 500 and transition metal layer 600 to a temperature of between about 250° C. and about 550° C. for at least about 0.1 second. In other advantageous embodiments, heating comprises a first heating step to a temperature between about 250° C. and about 350° C. for at least about 0.1 second to form the metal salicide layer 700, and a second heating step to a temperature of between about 350° C. and 550° C. for at least about 0.1 second to anneal metal salicide layer 700. One of ordinary skill in the art would understand how to adjust the temperature and duration of heating to achieve salicidation of different transition metals. One skilled in the art would further understand that metal salicidation can further include the use of conventional dry or wet etch procedures to selectively remove the unreacted portions of the transition metal layer 600 while leaving the metal salicide electrode substantially intact.

In some preferred embodiments, nickel salicide formation can be advantageously performed using relatively low temperatures as compared to other metals, which in turn, reduces the thermal budget that the device is exposed to during its fabrication, thereby reducing manufacturing costs. In some cases, for instance, heating is maintained at a temperature below about 400° C. to deter the formation of nickel disalicide. A nickel salicide layer is also preferred in some instances because nickel salicide has a lower resistivity as compared to a number of other transition metal salicides.

Figure 8:
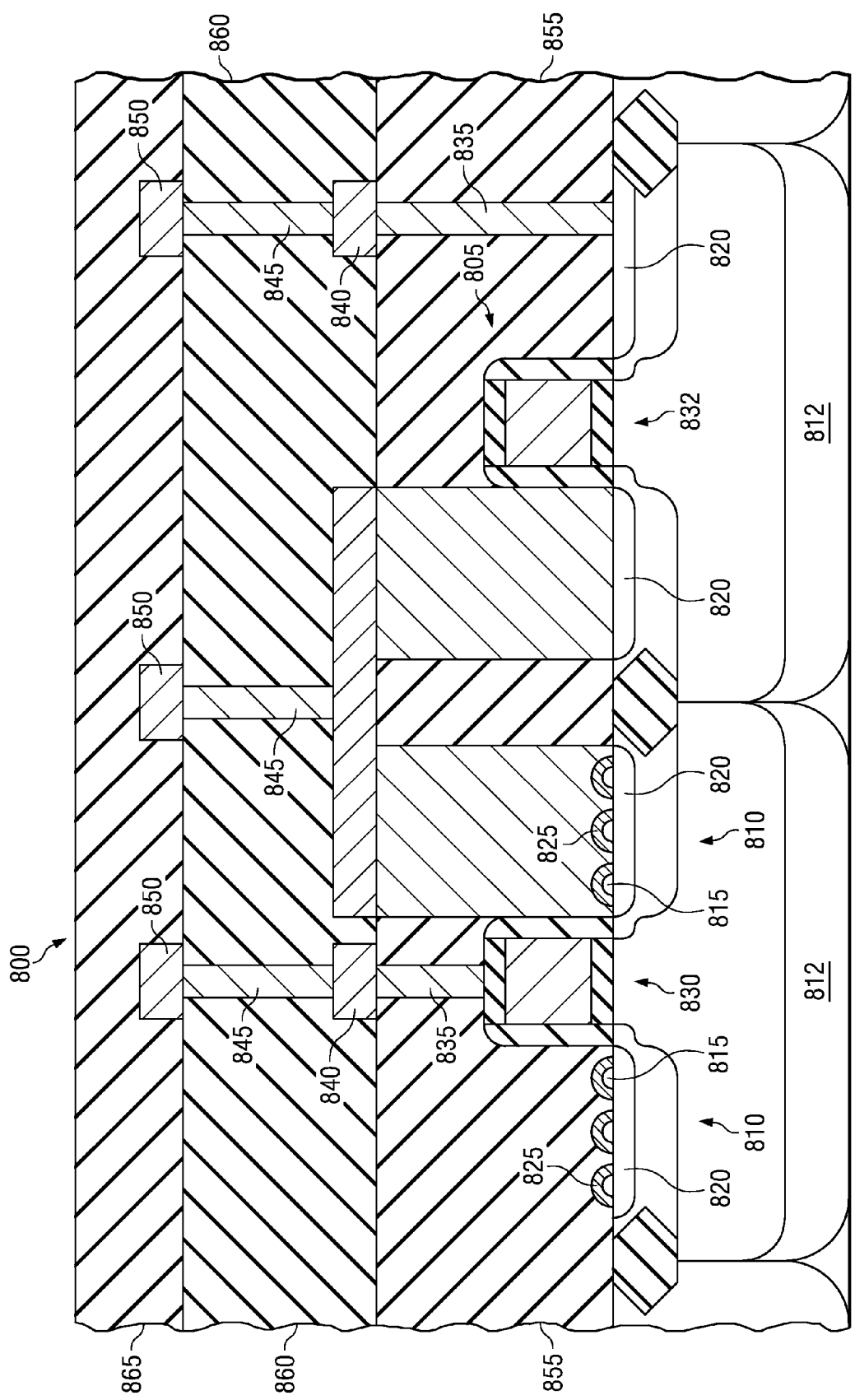
FIG. 8 presents a cross-sectional view of an exemplary integrated circuit of the present invention.

Still another aspect of the present invention is an integrated circuit. FIG. 8 depicts a cross-sectional view of an exemplary integrated circuit 800 that comprises a semiconductor device 805 having source/drain electrodes 810 formed over or in a semiconductor substrate 812. The source/drain electrodes 810 can comprise any of the embodiments presented above and illustrated in FIGS. 1 and 2-7. For instance, the source/drain electrodes 810 have a plurality of polysilicon grains 815 located over a source/drain region 820, with a metal salicide layer 825 conformally coating the plurality of polysilicon grains 815.

Preferred embodiments of the semiconductor device 805 comprise MOS transistors, and more preferably, one or more nMOS transistor 830 and pMOS transistor 832. In some cases, the semiconductor device 805 comprises a CMOS device. However the semiconductor device 805 can also comprise Junction Field Effect transistors, bipolar transistors, biCMOS transistors, or other conventional device components, and combinations thereof, that could benefit from having the electrodes 810 of the present invention.

As further illustrated in FIG. 8, the integrated circuit 800 further comprises interconnections 835, 840, 845, 850 on one or more insulating layers 855, 860, 865 located over the semiconductor device 805. One or more of the interconnections 835, 840, 845, 850 are connected to the source/drain electrodes 810 to thereby interconnect the semiconductor device 805 and form an operative device.

Although the present invention has been described in detail, one of ordinary skill in the art should understand that they can make various changes, substitutions and alterations herein without departing from the scope of the invention.

What is claimed is:

1. A method of manufacturing a source/drain electrode for a semiconductor device comprising:
    forming a silicon layer on a source/drain region;
    depositing seed atoms on said silicon layer;
    transforming said seed atoms and said silicon layer to form a plurality of polysilicon grains over said source/drain region; and
    depositing a transition metal layer over said polysilicon grains and reacting at least a portion of said transition metal layer and said polysilicon grains to form a metal salicide layer conformally coating said polysilicon grains.

2. The method as recited in claim 1, wherein forming comprises chemical vapor depositing an amorphous silicon layer.

3. The method as recited in claim 2, wherein said chemical vapor depositing comprises a temperature of less than about 600° C. and pressure of at least about $1 \times 10^{-3}$ Torr.

4. The method as recited in claim 1, wherein depositing said seed atoms comprises introducing a silicon-bearing precursor into a chemical vapor deposition chamber and heating said chemical vapor deposition chamber to a temperature of between about 550° C. to about 650° C. at a pressure of at least about $1 \times 10^{-3}$ Torr.

5. The method as recited in claim 1, wherein transforming comprises annealing said seed atoms and said silicon layer together by heating to a temperature between about 500° C. and about 650° C. at a pressure of at least about $1 \times 10^{-3}$ Torr.

6. The method as recited in claim 1, wherein depositing and transforming are performed in a same chemical vapor deposition tool.

* * * * *